United States Patent
Kniknie et al.

(10) Patent No.: US 10,192,773 B2
(45) Date of Patent: Jan. 29, 2019

(54) SEMICONDUCTOR DEVICE POSITIONING SYSTEM AND METHOD FOR SEMICONDUCTOR DEVICE POSITIONING

(71) Applicant: NEXPERIA B.V., Nijmegen (NL)

(72) Inventors: Thijs Kniknie, Den Bosch (NL); Jozef Petrus Wilhelmus Stokkermans, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 124 days.

(21) Appl. No.: 15/187,162

(22) Filed: Jun. 20, 2016

(65) Prior Publication Data

US 2017/0365502 A1 Dec. 21, 2017

(51) Int. Cl.
| | |
|---|---|
| *H01L 21/687* | (2006.01) |
| *G01D 21/00* | (2006.01) |
| *H01L 21/68* | (2006.01) |
| *G03F 7/20* | (2006.01) |
| *G05B 19/404* | (2006.01) |

(52) U.S. Cl.
CPC ....... *H01L 21/68764* (2013.01); *G01D 21/00* (2013.01); *G03F 7/70725* (2013.01); *G03F 7/70766* (2013.01); *G05B 19/404* (2013.01); *H01L 21/681* (2013.01); *H01L 21/68785* (2013.01)

(58) Field of Classification Search
CPC ..... H01L 21/68764; G01D 21/00; B23Q 3/18
USPC .................................. 33/568, 1 M, 569, 573
See application file for complete search history.

(56) References Cited

U.S. PATENT DOCUMENTS

| | | | | |
|---|---|---|---|---|
| 3,744,902 A | * | 7/1973 | Henker | G03F 7/70716 269/58 |
| 4,676,649 A | * | 6/1987 | Phillips | B23Q 1/385 250/548 |
| 5,310,104 A | | 5/1994 | Zaidel et al. | |
| 5,684,856 A | * | 11/1997 | Itoh | G03F 7/70716 250/453.11 |
| 5,699,621 A | * | 12/1997 | Trumper | B23Q 1/34 33/1 M |
| 5,760,564 A | * | 6/1998 | Novak | B23Q 3/00 269/55 |

(Continued)

FOREIGN PATENT DOCUMENTS

WO 2013171863 A1 11/2013

OTHER PUBLICATIONS

Wafer Expander; Technovision, Inc., retrieved from Internet, http://www.techvision.co.jp/english/products/expander.htm; Oct. 25, 2008.

(Continued)

*Primary Examiner* — Christopher W Fulton
(74) *Attorney, Agent, or Firm* — Ohlandt, Greeley, Ruggiero & Perle, L.L.P.

(57) ABSTRACT

A positioning system and method for positioning a semiconductor device are disclosed. In an embodiment, a positioning system for positioning a semiconductor device includes a long-stroke stage configured to be movable with respect to a supporting structure within a plane and a short-stroke stage attached to the long-stroke stage and configured to carry a semiconductor device and to be rotatable within the plane. The long-stroke stage acts as a balance mass between the short-stroke stage and the supporting structure.

19 Claims, 6 Drawing Sheets

(56) References Cited

U.S. PATENT DOCUMENTS

| | | | | |
|---|---|---|---|---|
| 6,028,376 | A * | 2/2000 | Osanai | G03F 7/70716 310/12.13 |
| 6,327,929 | B1 * | 12/2001 | Yanagisawa | B23Q 1/017 108/143 |
| 6,359,679 | B1 * | 3/2002 | Ito | G03B 27/62 355/53 |
| 6,434,840 | B1 * | 8/2002 | Jourtchenko | B23Q 1/5412 33/1 M |
| 6,442,858 | B1 * | 9/2002 | Asano | G03F 7/70725 33/1 M |
| 6,671,973 | B2 * | 1/2004 | Takemura | G01B 7/28 33/1 M |
| 6,688,016 | B2 * | 2/2004 | Suhara | H05K 13/0413 269/153 |
| 7,478,481 | B2 * | 1/2009 | Reynaerts | G01D 5/24438 33/1 M |
| 9,870,961 | B2 * | 1/2018 | Iwamoto | H01L 22/20 |
| 2004/0177520 | A1 * | 9/2004 | Nakamura | G03F 7/70058 33/1 M |
| 2004/0239910 | A1 * | 12/2004 | Ukaji | G03F 7/70725 355/72 |
| 2004/0263108 | A1 * | 12/2004 | Lim | B23Q 1/012 318/640 |
| 2006/0005911 | A1 | 1/2006 | Kubo et al. | |
| 2006/0012020 | A1 | 1/2006 | Gillen | |
| 2007/0137031 | A1 | 6/2007 | Bosch et al. | |
| 2007/0284950 | A1 * | 12/2007 | Ito | G03F 7/70716 310/12.06 |
| 2008/0061275 | A1 | 3/2008 | Stokkermans | |
| 2008/0143994 | A1 * | 6/2008 | Shibazaki | G03F 7/70725 355/72 |
| 2008/0196229 | A1 | 8/2008 | Van Beuningen | |
| 2010/0044943 | A1 * | 2/2010 | Vermeulen | G03F 7/70716 269/71 |
| 2010/0223767 | A1 | 9/2010 | Vianen et al. | |
| 2012/0057140 | A1 * | 3/2012 | Aoki | G03F 7/70716 355/53 |
| 2012/0145920 | A1 * | 6/2012 | Ogawa | H01J 37/20 250/442.11 |
| 2014/0375975 | A1 * | 12/2014 | Van De Ven | G03F 7/70758 355/72 |

OTHER PUBLICATIONS

Die Matrix Expanders, Model UH132 Series: (UH132, UH132-12)—Motor Drive, retrieved from Internet, http://www.ultronsystems.com/USI-ProdDMExpand.html#DMExpanders; Jan. 28, 2013.

Die Matrix Expander, Model UH130; Ultron Systems, Inc.; 4 pgs.; Feb. 9, 2004.

\* cited by examiner

SEMICONDUCTOR DEVICE POSITIONING SYSTEM AND METHOD FOR SEMICONDUCTOR DEVICE POSITIONING

BACKGROUND

Modern components, such as integrated circuits (ICs) or discrete transistors, are produced on a large scale by fabricating several components on a substrate. For example, various IC manufacturing processes are implemented to fabricate electronic circuits on a silicon wafer. Typically, hundreds or thousands of components or IC dies are fabricated on a single wafer.

During the IC manufacturing process, a semiconductor device positioning system is used to position or place a semiconductor device such that various operations can be performed on the semiconductor device. For example, a semiconductor device positioning system can include a semiconductor device holding stage to hold a semiconductor device in a specific location and/or include a semiconductor device driver stage to move a semiconductor device for semiconductor device processing operations (e.g., a deposition process or an etching process). However, increasing the acceleration of a semiconductor device driver stage generally results in higher acceleration forces and thus higher reaction forces on the supporting structure of the semiconductor device driver stage. The higher reaction forces on the supporting structure can result in dynamic disturbances on the supporting structure, on the semiconductor device driver stage, and on other modules that are mounted on the supporting structure.

SUMMARY

A positioning system and method for positioning a semiconductor device are disclosed. In an embodiment, a positioning system for positioning a semiconductor device includes a long-stroke stage configured to be linearly movable with respect to a supporting structure within a plane and a short-stroke stage attached to the long-stroke stage and configured to carry a semiconductor device and to be linearly moveable within the plane. The long-stroke stage acts as a balance mass between the short-stroke stage and the supporting structure.

In an embodiment, the long-stroke stage has a first range of motion relative to the supporting structure. The short-stroke stage is supported by the long-stroke stage and has a second range of motion relative to the long-stroke stage. The second range of motion is smaller than the first range of motion.

In an embodiment, the short-stroke stage is further configured to be rotatable within the plane.

In an embodiment, the long-stroke stage is further configured to be movable in a first direction and a second direction.

In an embodiment, the long-stroke stage includes a first long-stroke body configured to be linearly movable in the first direction and a second long-stroke body configured to be linearly movable in the second direction.

In an embodiment, the positioning system further includes a first set of linear guides attached to the supporting structure and the first long-stroke body and a second set of linear guides attached to the first and second long-stroke bodies.

In an embodiment, the positioning system further includes a first long-stroke driver device configured to drive the first long-stroke body on the first set of linear guides along the first direction and a second long-stroke driver device configured to drive the second long-stroke body on the second set of linear guides along the second direction.

In an embodiment, the positioning system further includes a plurality of sensor devices configured to measure positions of the first and second long-stroke bodies during a movement of the long-stroke stage.

In an embodiment, the short-stroke stage includes a short-stroke body attached to the second long-stroke body through a set of linear guides.

In an embodiment, the positioning system further includes short-stroke driver devices configured to linearly move the short-stroke stage.

In an embodiment, the short-stroke driver devices are further configured to rotate the short-stroke stage clockwise or counter-clockwise.

In an embodiment, a positioning system for positioning a wafer includes a long-stroke stage configured to be movable in a first direction and a second direction with a first range of motion relative to a supporting structure and a short-stroke stage attached to the long-stroke stage and configured to carry a wafer and to linearly movable with a second range of motion relative to the long-stroke stage. The first direction is perpendicular to the second direction. The second range of motion is smaller than the first range of motion. The long-stroke stage acts as a balance mass between the short-stroke stage and the supporting structure.

In an embodiment, the long-stroke stage includes a first long-stroke body configured to be movable in the first direction and a second long-stroke body configured to be movable in the second direction.

In an embodiment, the positioning system further includes a first set of linear guides attached to the supporting structure and the first long-stroke body, a second set of linear guides attached to the first and second long-stroke bodies, a first long-stroke driver device configured to drive the first long-stroke body on the first set of linear guides along the first direction, and a second long-stroke driver device configured to drive the second long-stroke body on the second set of linear guides along the second direction.

In an embodiment, the positioning system further includes sensor devices configured to check positions of the first and second long-stroke bodies during a movement of the long-stroke stage.

In an embodiment, the short-stroke stage includes a short-stroke body attached to the second long-stroke body through a set of linear guides.

In an embodiment, the positioning system further includes short-stroke driver devices configured to linearly move the short-stroke stage.

In an embodiment, a method for positioning a semiconductor device involves linearly moving a long-stroke stage with respect to a supporting structure within a plane and linearly moving a short-stroke stage carrying a semiconductor device within the plane. The short-stroke stage is supported by the long-stroke stage.

In an embodiment, linearly moving the long-stroke stage involves moving the long-stroke stage with a first range of motion relative to the supporting structure. Linearly the short-stroke stage involves moving the short-stroke stage with a second range of motion relative to the long-stroke stage. The second range of motion is smaller than the first range of motion.

In an embodiment, the method further involves rotating the short-stroke stage within the plane. Linearly moving the long-stroke stage involves moving the long-stroke stage in a first direction and a second direction.

Other aspects and advantages of embodiments of the present invention will become apparent from the following detailed description taken in conjunction with the accompanying drawings.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

Figure 1:
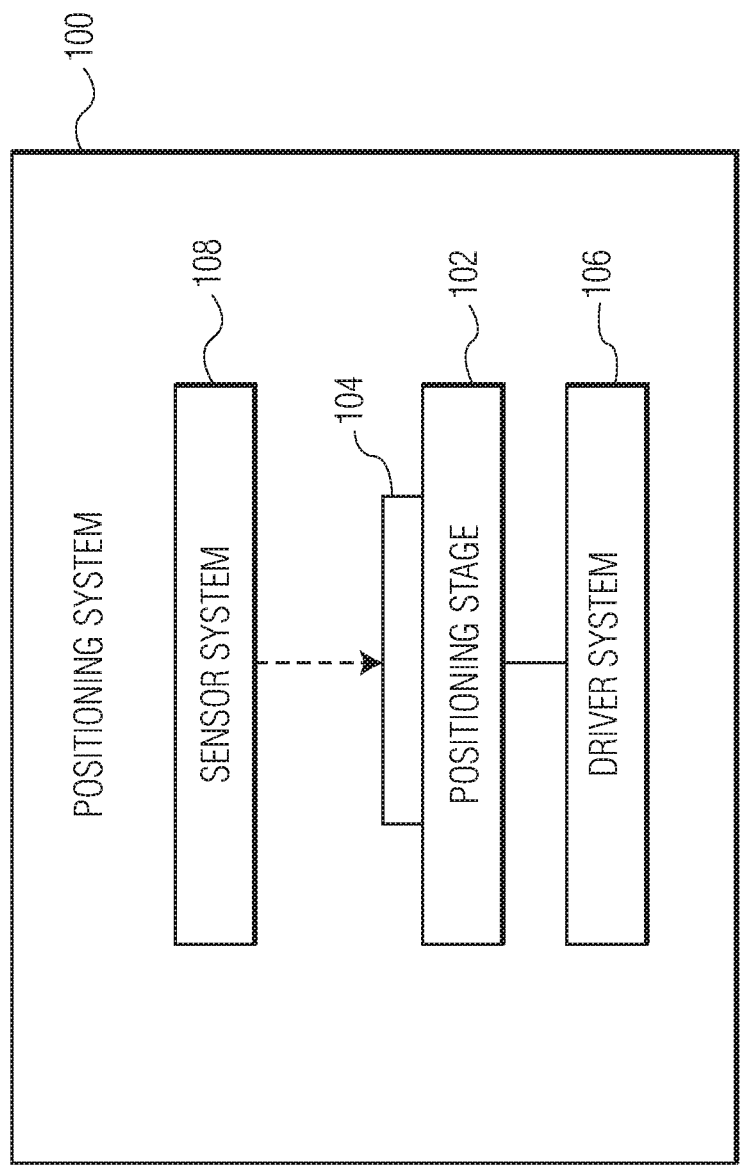
FIG. 1 depicts a positioning system in accordance with an embodiment of the invention.

FIG. 1 depicts a positioning system 100 for positioning a semiconductor device 104 in accordance with an embodiment of the invention. The positioning system is configured to position the semiconductor device 104 for processing. In the embodiment depicted in FIG. 1, the positioning system includes a positioning stage 102, a driver system 106, and a sensor system 108. The positioning system can be used in various semiconductor device processing devices. In some embodiments, the positioning system is used in a wafer processing system, e.g., a die bonding apparatus. Although the illustrated positioning system is shown with certain components and described with certain functionality herein, other embodiments of the positioning system may include fewer or more components to implement the same, less, or more functionality. In some embodiments, the positioning system may include an IC chip transfer mechanism.

The positioning stage 102 of the positioning system 100 is configured to carry the semiconductor device 104 to a specific position/location for semiconductor device processing operations (e.g., semiconductor device deposition operations, semiconductor device etching operations, semiconductor device transfer operations, or semiconductor device expanding operations). The position stage may hold the semiconductor device in a specific position or drive/move the semiconductor device to a specific position for semiconductor device processing operations.

The driver system 106 of the positioning system 100 is configured to drive (e.g., linearly move or rotate) the positioning stage. The driver system may include at least one motor and/or at least one set of linear guides/rails.

The sensor system 108 of the positioning system 100 is configured to measure or to check the position of the semiconductor device 104. The sensor system 106 may be a projection system.

Figure 2:
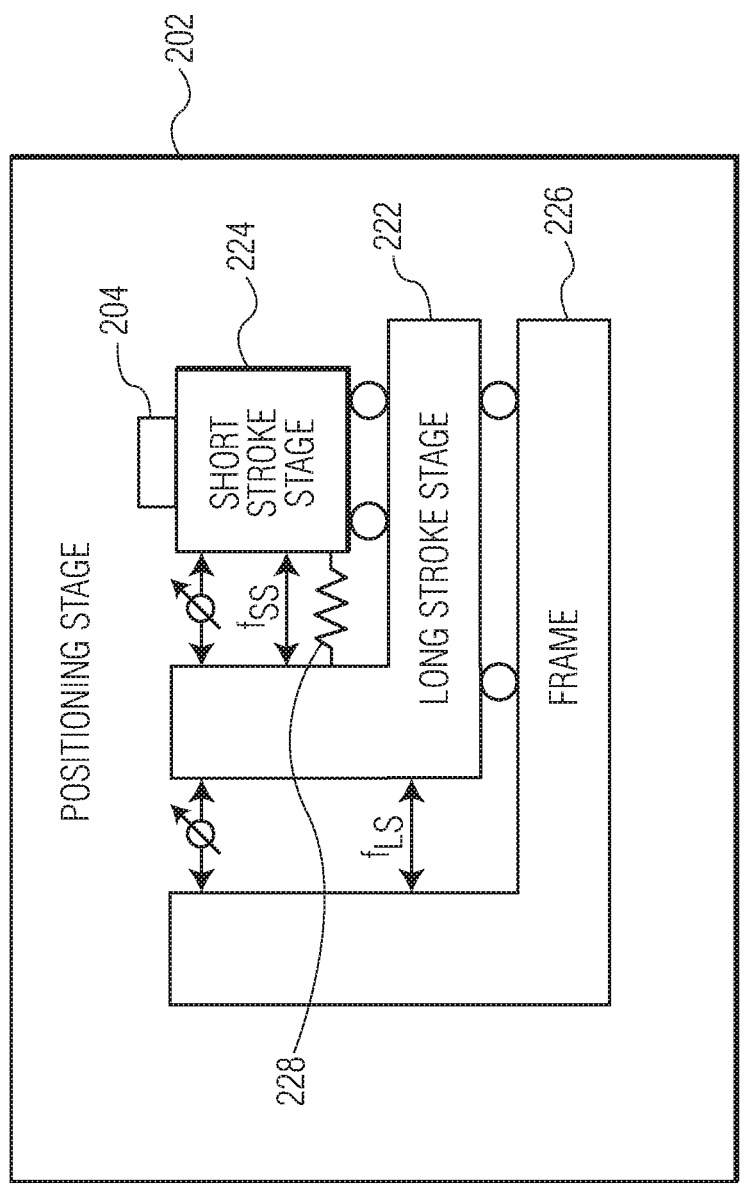
FIG. 2 depicts an embodiment of a positioning stage of the semiconductor device positioning system depicted in FIG. 1.

FIG. 2 depicts an embodiment of the positioning stage 102 of the positioning system 100 depicted in FIG. 1. In the embodiment depicted in FIG. 2, a positioning stage 202 includes a long-stroke stage 222 and a short-stroke stage 224. The positioning system is configured to position a semiconductor device 204 by controlling the position of the semiconductor device with respect to a supporting structure 226. The supporting structure may be any suitable supporting device/system. In an embodiment, the support structure is a frame. In some embodiments, the positioning stage is used in a die bonding apparatus in which high indexing speed is combined with high accuracy. The positioning stage 202 depicted in FIG. 2 is one possible embodiment of the positioning stage 102 depicted in FIG. 1. However, the positioning stage 102 depicted in FIG. 1 is not limited to the embodiment shown in FIG. 2.

In the embodiment depicted in FIG. 2, the long-stroke stage 222 is configured to be movable with respect to the supporting structure 226. The short-stroke stage 224 is attached to the long-stroke stage (e.g., through at least one attachment device 228 (e.g., a plate spring or any other suitable device) and is configured to carry the semiconductor device 204. In some embodiments, the long-stroke stage is configured to be linearly movable with respect to the supporting structure and the short-stroke stage is configured to carry a semiconductor device and to be linearly movable and/or rotatable. In some embodiments, the long-stroke stage has a first range of motion relative to the supporting structure. The short-stroke stage has a second range of motion relative to the long-stroke stage, which is smaller than the first range of motion. In some embodiments, the long-stroke stage is configured to be linearly movable while the short-stroke stage is configured to be linearly movable and rotatable. The long-stroke stage acts as a balance mass between the short-stroke stage and the supporting structure. Consequently, the long-stroke stage can serve as a balance mass for the short-stroke stage's acceleration forces and reduce the reaction forces on the supporting structure, which enables high positioning accuracy at high speed.

Using the long-stroke stage 222 and the short-stroke stage 224, the positioning stage 202 can reduce acceleration forces on the supporting structure 226. Because the long-stroke stage does not have a high positioning accuracy requirement, the acceleration forces of the long-stroke can be lower and thus lower forces are transferred to the supporting structure. Consequently, high acceleration forces produced by the short-stroke stage are absorbed by the inertia of the long-stroke stage and are not transferred to the supporting structure. The long-stroke stage integrates both balance mass and measurement system functionalities and can be driven with low-performance actuators because the positioning accuracy requirement for the long-stroke stage is lower than the positioning accuracy requirement for the short-stroke stage. Compared to a semiconductor device positioning stage in which a separate moving balance mass is used with a short-stroke stage and a long-stroke stage, the positioning stage 202 depicted in FIG. 2 uses the long-stroke stage as a balance mass between the short-stroke stage and the semiconductor device. Consequently, the positioning system 202 depicted in FIG. 2 can be implemented without a separate moving balance mass.

In the positioning stage 202 depicted in FIG. 2, the position of the short-stroke stage 224 relative to the supporting structure 226 is the sum of the position of the short-stroke stage relative to the long-stroke stage 222 and the position of the long-stroke stage relative to the supporting structure. For example, the y-axis position of the short-stroke stage relative to the supporting structure can be expressed as:

$$ySS2BF = ySS2LS + yLS2BF \quad (1)$$

where ySS2BF represents the y-axis position of the short-stroke stage relative to the supporting structure, ySS2LS represents the y-axis position of the short-stroke stage relative to the long-stroke stage, and yLS2BF represents the y-axis position of the long-stroke stage relative to the supporting structure. The relative positions between the long-stroke stage, the short-stroke stage, and the supporting structure can be measured by sensors of the sensor system 108. In addition, the force of the short-stroke stage only acts on the long-stroke. The force of the short-stroke stage, which is represented as $F_{SS}$, is compensated by the long-stroke stage, and only the force of the long-stroke stage, which is represented as $F_{LS}$, affects the supporting structure.

The long-stroke stage 222 can be controlled with various techniques. In some embodiments, a setpoint profile of the long-stroke stage is computed as the sum of high-speed index profiles of the short-stroke stage 224. The long-stroke stage may be controlled using the computed setpoint profile with a low range of motion, resulting in low controller forces and thus low reaction forces to the supporting structure 226. The low reaction forces to the supporting structure can effectively make the long-stroke stage a passive balance mass that moves along with the short-stroke stage. Alternatively, the long-stroke stage may be controlled using the computed setpoint profile with a high range of motion, canceling out a large part of the high reaction forces of the short-stroke stage and causing the long-stroke stage to act as an active balance mass for the short-stroke stage. In some embodiments, the position of the long-stroke stage relative to the supporting structure is not directly controlled. Rather, the position difference between the long-stroke stage and the short-stroke stage is controlled (e.g., set to a constant value) with a low controller bandwidth, ensuring low reaction forces in the direction of the supporting structure. The low reaction forces to the supporting structure can effectively cause the long-stroke stage to act as a passive balance mass for the short-stroke stage.

Figure 3:
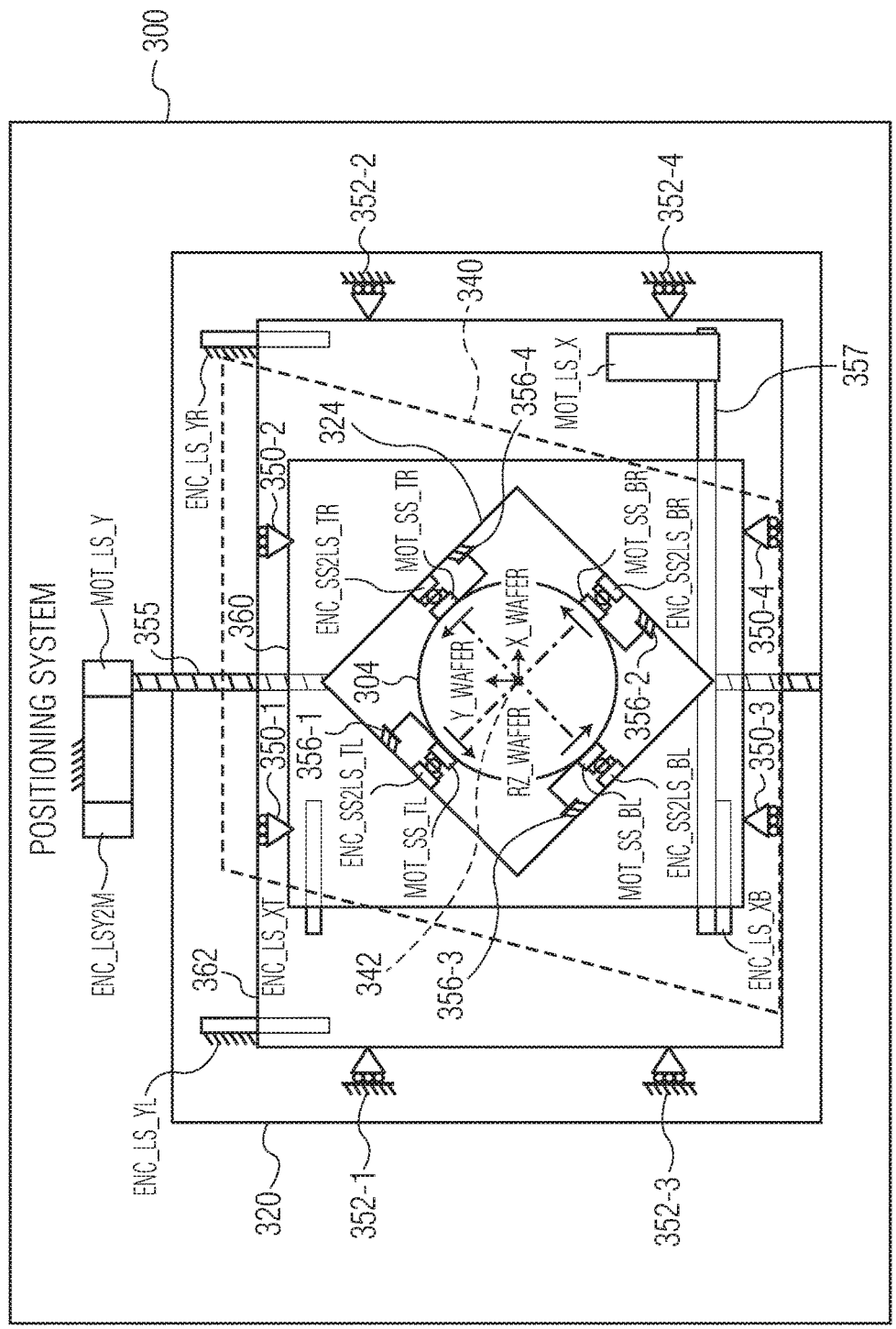
FIG. 3 shows a schematic overview of a positioning system in accordance with an embodiment of the invention.

FIG. 3 shows a schematic overview of a positioning system 300 in accordance with an embodiment of the invention. In the embodiment depicted in FIG. 3, the positioning system includes a long-stroke stage 320 with corresponding drivers/motors MOT_LS_X, MOT_LS_Y and sensors/encoders ENC_LS_XT, ENC_LS_XB, ENC_LS_YR, ENC_LSY2M, ENC_LS_YL and a short-stroke stage 324 with corresponding drivers/motors MOT_SS_TL, MOT_SS_BL, MOT_SS_BR, MOT_SS_TR and sensors/encoders ENC_SS2LS_TL, ENC_SS2LS_BL, ENC_SS2LS_BR, ENC_SS2LS_TR. The positioning system has three degrees of freedom (i.e., can move in three directions $X_{\_WAFER}$, $Y_{\_WAFER}$, and $R_Z$) for a silicon wafer 304, including two in-plane translations for the long-stroke stage and two in-plane translations and one in-plane rotation for the short-stroke stage. The positioning system 300 depicted in FIG. 3 can also be used for other semiconductor devices. The positioning system can have various ranges of motion and can position wafers of various sizes. In an embodiment, the long-stroke stage may have a range of motion of about 350 millimeter (mm) in X and Y direction and the short-stroke stage has a range of motion of about 6 mm in X and Y direction. The short-stroke stage may have a range of rotation about 0.5 degrees while the wafer size can be 200 mm or 300 mm. The positioning system 300 depicted in FIG. 3 is one possible embodiment of the positioning system 100 depicted in FIG. 1. However, the positioning system 100 depicted in FIG. 1 is not limited to the embodiment shown in FIG. 3.

In the embodiment depicted in FIG. 3, the long-stroke stage 320 is configured to be linearly movable with respect to a supporting structure (not shown) within a plane 340. The short-stroke stage 324 is attached to the long-stroke stage and is configured to carry the silicon wafer 304 and to be linearly movable and rotatable within the plane 340 around an axis 342 that is perpendicular to the plane. The long-stroke stage acts as a balance mass between the short-stroke stage and the supporting structure. The long-stroke stage has a first range of motion relative to the supporting structure while the short-stroke stage has a second range of motion relative to the long-stroke stage that is smaller than the first range of motion.

The long-stroke stage 320 can move the silicon wafer 304 in the x-direction, $X_{\_WAFER}$, and in the y-direction, $Y_{\_WAFER}$, which is perpendicular to the x-direction, $X_{\_WAFER}$. In the embodiment depicted in FIG. 3, the long-stroke stage includes a long-stroke X body 360 that is configured to be movable along x-direction linear guide/rails 350-1, 350-2, 350-3, 350-4 attached to the supporting structure and a long-stroke Y body 362 that is attached to the long-stroke X body and configured to be movable along y-direction linear guide/rails 352-1, 352-2, 352-3, 352-4 attached to the long-stroke stage. Specifically, the motor MOT_LS_X is configured to drive the long-stroke X body along the x-direction linear guide/rails in the x-direction, $X_{\_WAFER}$ through a belt or spindle that converts rotation of the motor MOT_LS_X to the linear movement of the long-stroke X body. The top sensor, ENC_LS_XT, and the bottom sensor, ENC_LS_XB, are configured to measure or check the position of the long-stroke X body in the x-direction, $X_{\_WAFER}$, during a movement of the long-stroke stage. The motor MOT_LS_Y is configured to drive the long-stroke Y body along the y-direction linear guide/rails in the y-direction, $Y_{\_WAFER}$ through a belt or spindle that converts rotation of the motor MOT_LS_Y to the linear movement of the long-stroke Y body. The left sensor, ENC_LS_YL, the middle sensor, ENC_LSY2M, and the right sensor, ENC_LS_YR, are configured to measure or check the position of the long-stroke Y body in the y-direction, $Y_{\_WAFER}$, during a movement of the long-stroke stage.

The short-stroke stage 324 is configured to be movable in the x-direction, X_WAFER, to be movable in the y-direction, $Y_{\_WAFER}$, and to be rotatable clockwise or counter-clockwise. In the embodiment depicted in FIG. 3, the short-stroke stage is attached to the long-stroke stage. Consequently, the motor MOT_LS_X can drive the short-stroke stage along the x-direction linear guide/rails 350-1, 350-2, 350-3, 350-4 in the x-direction, $X_{\_WAFER}$, and the motor MOT_LS_Y can drive the short-stroke stage along the y-direction linear guide/rails 352-1, 352-2, 352-3, 352-4 in the y-direction, $Y_{\_WAFER}$. In addition, in the embodiment depicted in FIG. 3, the corresponding motors MOT_SS_TL, MOT_SS_BL, MOT_SS_BR, MOT_SS_TR are configured to linearly move the silicon wafer 304 along the x-direction, $X_{\_WAFER}$, or the y-direction, $Y_{\_WAFER}$, or rotate the short-stroke stage and the silicon wafer 304 clockwise or counter-clockwise. Specifically, the top left motor, MOT_SS_TL, the bottom left motor, MOT_SS_BL, the bottom right motor, MOT_SS_BR, and the top right motor, MOT_SS_TR, are configured to linearly move the silicon wafer 304 along the x-direction, $X_{\_WAFER}$, through x-direction linear guide/rails 356-1, 356-2, or the y-direction, $Y_{\_WAFER}$, through y-direction linear guide/rails 358-1, 358-2 or to rotate the short-stroke stage and the silicon wafer clockwise or counter-clockwise. The top left sensor, ENC_SS2LS_TL, the bottom left sensor, ENC_SS2LS_BL, the bottom right sensor, ENC_SS2LS_BR, and the top right sensor, ENC_SS2LS_TR, are configured to measure or check the position of the short-stroke stage during movement.

Figure 4:
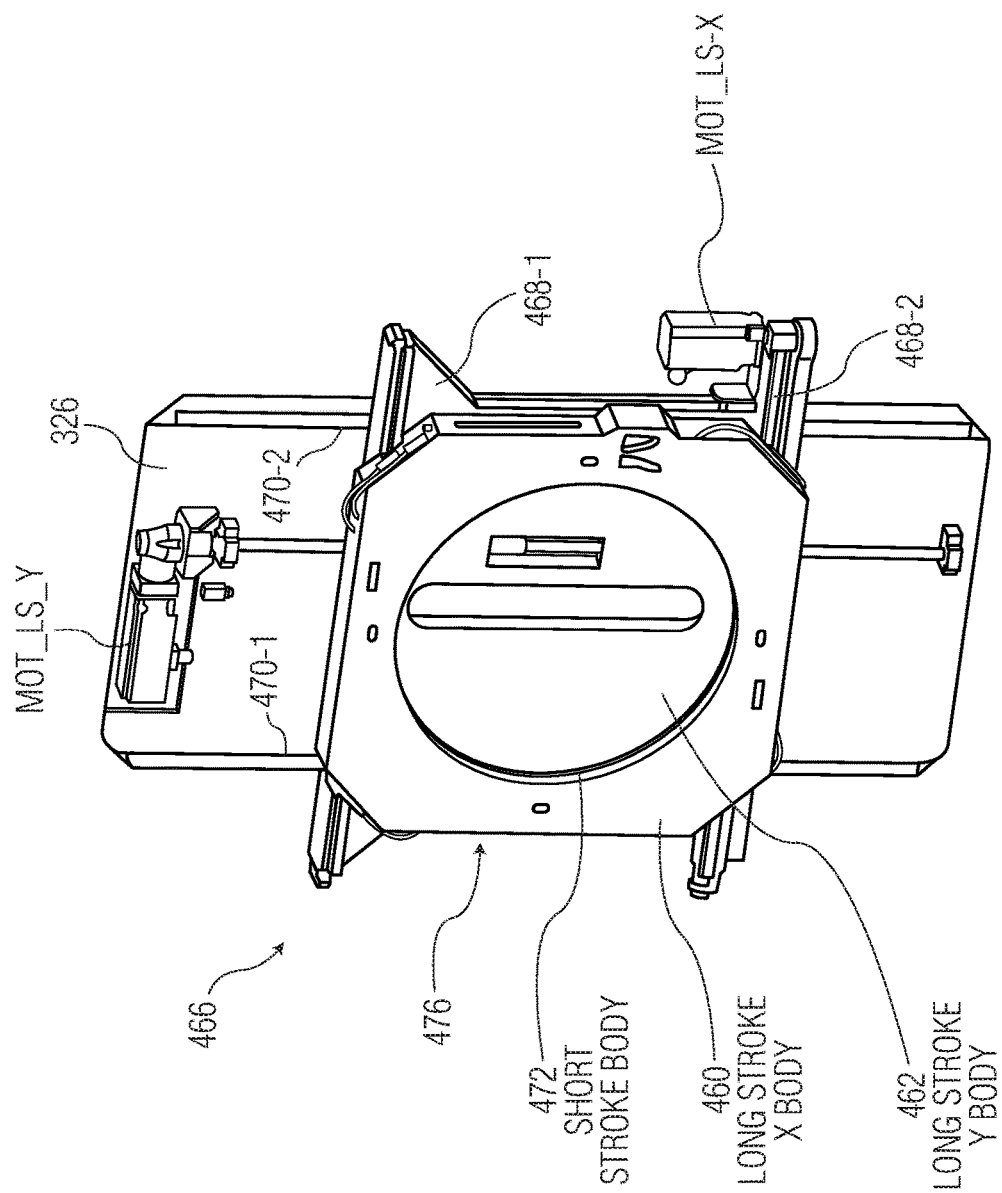
FIG. 4 is a perspective view of the positioning system depicted in FIG. 3.

FIG. 4 is a perspective view of the wafer positioning system 300 depicted in FIG. 4. In the perspective view shown in FIG. 4, the long-stroke stage 320 of the wafer positioning system 300 includes the long-stroke X body 360 configured to be movable in the x-direction and the long-stroke Y body 362 that is attached to the long-stroke X body and configured to be movable in the y-direction. The long-stroke X body is driven by the long-stroke X motor MOT_LS_X along x-direction linear guides 468-1, 468-2. The long-stroke Y body is driven by the long-stroke Y motor MOT_LS_Y on a set of y-direction linear guides 470-1, 470-2 in the y-direction. The y-direction linear guides and the long-stroke Y motor are fixed onto the supporting structure 326 (e.g., a supporting plate) while the long-stroke Y body is placed on moveable structures (e.g., wheels or rollers) on the y-direction linear guides. The x-direction linear guide is fixed to the long-stroke Y body while the long-stroke X body is placed on moveable structures (e.g., wheels or rollers) on the x-direction linear guide. The long-stroke X motor is attached to the long-stroke Y body or the x-direction linear guide. In the embodiment depicted in FIG. 1, the short-stroke stage 324 of the wafer positioning system 300 includes a short-stroke body 472, which is attached to the long-stroke X body. The short-stroke body and the long-stroke X body form a wafer carrier 476.

Figure 5:
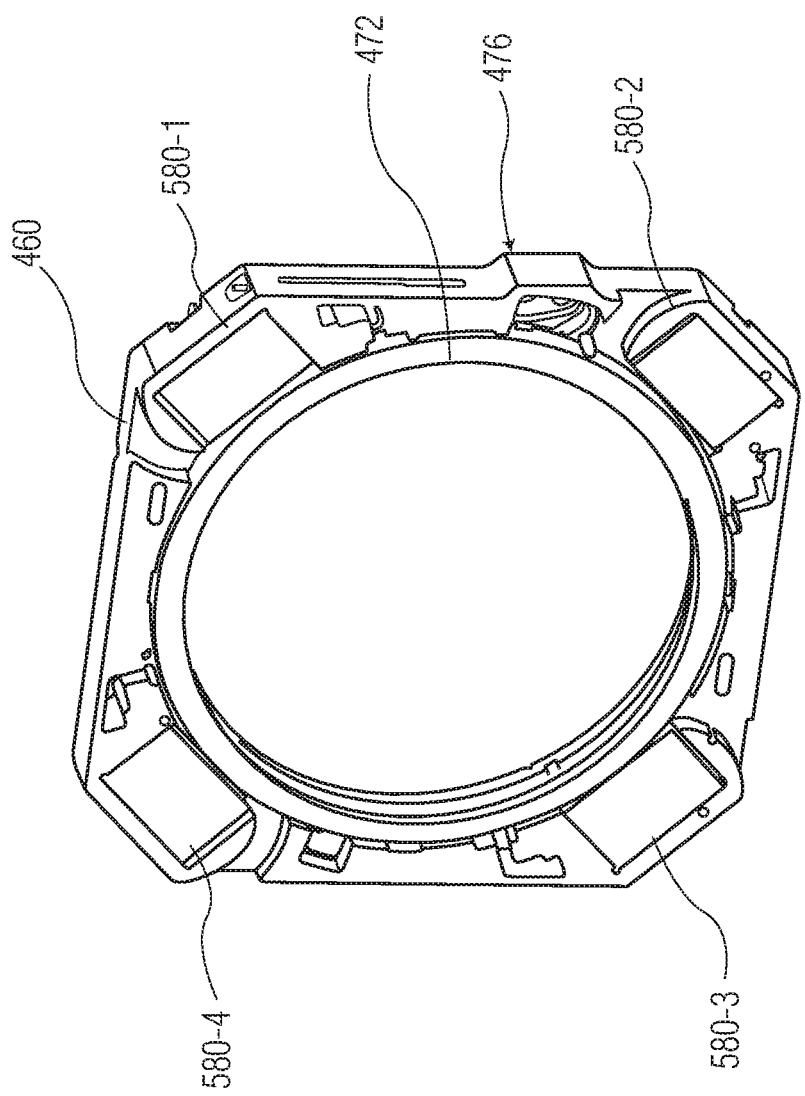
FIG. 5 is a perspective view of a carrier of the positioning system depicted in FIG. 4.

FIG. 5 is a perspective view of the wafer carrier 476 of the wafer positioning system 300 depicted in FIG. 4. In the perspective view shown in FIG. 5, four short-stoke actuators and encoders 580-1, 580-2, 580-3, 580-4 are used to linearly move or rotate the short-stroke body 472 and to measure or sense the position of the short-stroke body during movement.

Figure 6:
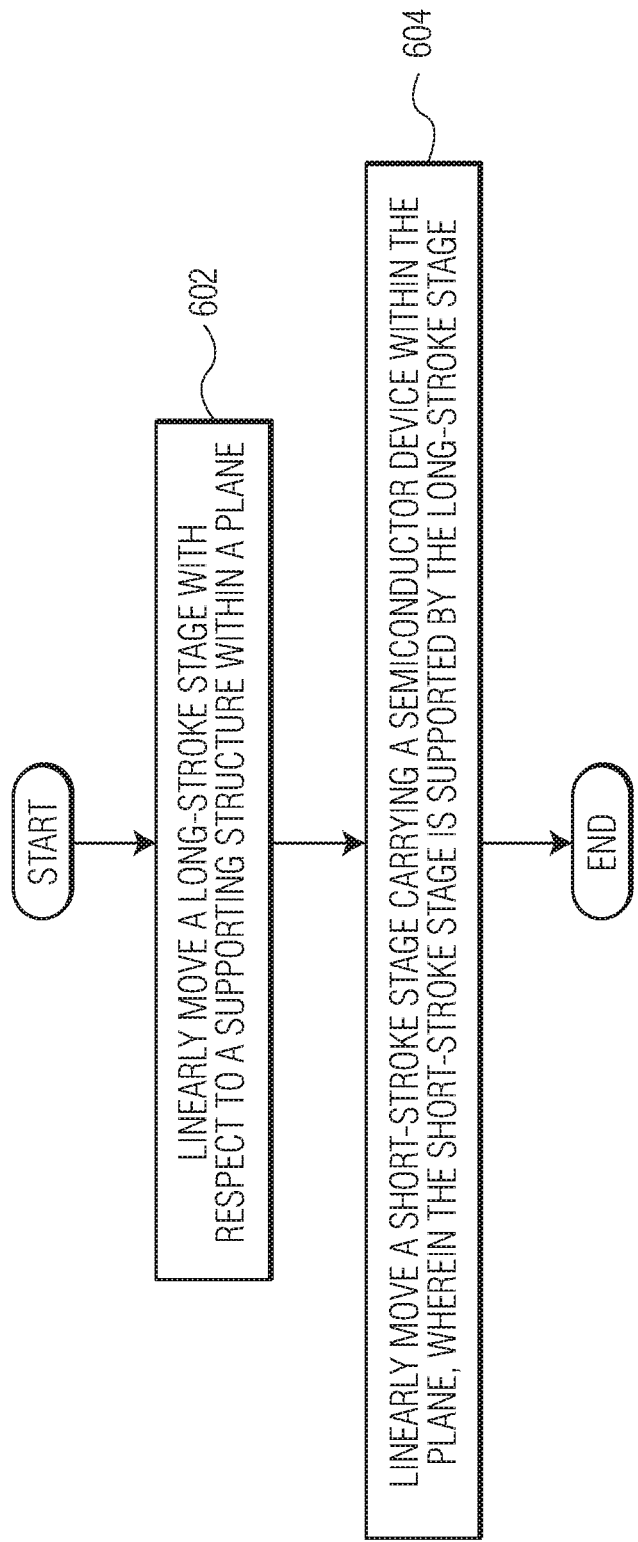
FIG. 6 is a process flow diagram of a method for positioning a semiconductor device in accordance with an embodiment of the invention.

FIG. 6 is a process flow diagram of a method for positioning a semiconductor device in accordance with an embodiment of the invention. At block 602, the long-stroke stage is linearly moved with respect to a supporting structure within a plane. At block 604, a short-stroke stage carrying the wafer is linearly moved within the plane, where the short-stroke stage is supported by the long-stroke stage.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods may be implemented using software instructions stored on a computer useable storage medium for execution by a computer. As an example, an embodiment of a computer program product includes a computer useable storage medium to store a computer readable program that, when executed on a computer, causes the computer to perform operations, as described herein.

The computer-useable or computer-readable medium can be an electronic, magnetic, optical, electromagnetic, infrared, or semiconductor system (or apparatus or device), or a propagation medium. Examples of a computer-readable medium include a semiconductor or solid-state memory, magnetic tape, a removable computer diskette, a random access memory (RAM), a read-only memory (ROM), a rigid magnetic disc, and an optical disc. Current examples of optical discs include a compact disc with read only memory (CD-ROM), a compact disc with read/write (CD-R/W), a digital video disc (DVD), and a Blu-ray disc.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A positioning system for positioning a semiconductor device, the positioning system comprising:
    a long-stroke stage configured to be linearly movable with respect to a supporting structure within a plane, wherein the long-stroke stage has a first range of motion relative to the supporting structure,
    a short-stroke stage attached to the long-stroke stage and configured to carry a semiconductor device and to be linearly movable within the plane, wherein the short-stroke stage is supported by the long-stroke stage and has a second range of motion relative to the long-stroke stage that is smaller than the first range of motion, wherein the short-stroke stage relative to the supporting structure has a position that is the sum of the position of the short-stroke stage relative to the position of a long-stroke stage and the position of the long-stoke stage relative to the supporting structure, and a plurality of sensors configured to measure relative positions between the long-stroke stage, the short-stroke stage, and the supporting structure so that the long-stroke stage acts as a balance mass between the short-stroke stage and the supporting structure.

2. The positioning system of claim 1, wherein the short-stroke stage is further configured to be rotatable within the plane.

3. The positioning system of claim 1, wherein the long-stroke stage is further configured to be movable in a first direction and a second direction.

4. The positioning system of claim 3, wherein the long-stroke stage comprises a first long-stroke body configured to be linearly movable in the first direction and a second long-stroke body configured to be linearly movable in the second direction.

5. The positioning system of claim 4, further comprising:
  a first set of linear guides attached to the supporting structure and the first long-stroke body; and
  a second set of linear guides attached to the first and second long-stroke bodies.

6. The positioning system of claim 5, further comprising:
  a first long-stroke driver device configured to drive the first long-stroke body on the first set of linear guides along the first direction; and
  a second long-stroke driver device configured to drive the second long-stroke body on the second set of linear guides along the second direction.

7. The positioning system of claim 4, wherein the plurality of sensor devices are configured to measure positions of the first and second long-stroke bodies during a movement of the long-stroke stage.

8. The positioning system of claim 4, wherein the short-stroke stage comprises a short-stroke body attached to the second long-stroke body through a set of linear guides.

9. The positioning system of claim 8, further comprising a plurality of short-stroke driver devices configured to linearly move the short-stroke stage.

10. The positioning system of claim 9, wherein the short-stroke driver devices are further configured to rotate the short-stroke stage clockwise or counter-clockwise.

11. A positioning system for positioning a wafer, the positioning system comprising:
  a long-stroke stage configured to be linearly movable in a first direction and a second direction with a first range of motion relative to a supporting structure, wherein the first direction is perpendicular to the second direction; and
  a short-stroke stage attached to the long-stroke stage and configured to carry a wafer and to be linearly movable with a second range of motion relative to the long-stroke stage, wherein the second range of motion is smaller than the first range of motion,
  wherein the relative position of the short-stroke stage relative to the supporting structure is the sum of the position of the short-stroke stage relative to the position of long-stroke stage and the position of the long-stoke stage relative to the supporting structure; and
  a plurality of sensors configured to measure relative positions between the long-stroke stage, the short-stroke stage, and the supporting structure so that the long-stroke stage acts as a balance mass between the short-stroke stage and the supporting structure.

12. The positioning system of claim 11, wherein the long-stroke stage comprises a first long-stroke body configured to be movable in the first direction and a second long-stroke body configured to be movable in the second direction.

13. The positioning system of claim 12, further comprising:
  a first set of linear guides attached to the supporting structure and the first long-stroke body;
  a second set of linear guides attached to the first and second long-stroke bodies;
  a first long-stroke driver device configured to drive the first long-stroke body on the first set of linear guides along the first direction; and
  a second long-stroke driver device configured to drive the second long-stroke body on the second set of linear guides along the second direction.

14. The positioning system of claim 13, wherein the plurality of sensor devices are configured to check positions of the first and second long-stroke bodies during a movement of the long-stroke stage.

15. The positioning system of claim 12, wherein the short-stroke stage comprises a short-stroke body attached to the second long-stroke body through a set of linear guides.

16. The positioning system of claim 15, further comprising:
  a plurality of short-stroke driver devices configured to linearly move the short-stroke stage.

17. A method for positioning a semiconductor device, the method comprising:
  linearly moving a long-stroke stage with a first range of motion respect to a supporting structure within a plane; and
  linearly moving a short-stroke stage carrying a semiconductor device within a second range of motion within the plane so that a position of the short-stroke stage relative to the supporting structure is the sum of the position of the short-stroke stage relative to a position of long-stroke stage and the position of the long-stoke stage relative to the supporting structure, wherein the short-stroke stage is supported by the long-stroke stage,
  wherein the long-stroke stage acts as a balance mass between the short-stroke stage and the supporting structure, and
  wherein the semiconductor device includes a plurality of sensors configured to measure relative positions between the long-stroke stage, the short-stroke stage, and the supporting structure so that the long-stroke stage acts as the balance mass between the short-stroke stage and the supporting structure.

18. The method of claim 17, wherein the second range of motion is smaller than the first range of motion.

19. The method of claim 18, further comprising rotating the short-stroke stage within the plane, wherein linearly moving the long-stroke stage comprises moving the long-stroke stage in a first direction and a second direction.

* * * * *